United States Patent
Tanaka

(10) Patent No.: US 9,719,869 B2
(45) Date of Patent: Aug. 1, 2017

(54) LOAD MEASURING APPARATUS AND LOAD MEASURING METHOD

(71) Applicant: Ebara Corporation, Tokyo (JP)

(72) Inventor: Hideaki Tanaka, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 15/045,643

(22) Filed: Feb. 17, 2016

(65) Prior Publication Data

US 2016/0243592 A1    Aug. 25, 2016

(30) Foreign Application Priority Data

Feb. 24, 2015 (JP) ................. 2015-033910

(51) Int. Cl.
| | |
|---|---|
| G01L 1/04 | (2006.01) |
| B08B 1/04 | (2006.01) |
| B08B 13/00 | (2006.01) |
| H01L 21/67 | (2006.01) |
| G01L 5/00 | (2006.01) |

(52) U.S. Cl.
CPC ............... *G01L 1/048* (2013.01); *B08B 1/04* (2013.01); *B08B 13/00* (2013.01); *G01L 1/04* (2013.01); *G01L 5/0085* (2013.01); *H01L 21/67046* (2013.01)

(58) Field of Classification Search
CPC ......... G01L 1/048; G01L 1/04; G01L 5/0085; B08B 1/04; B08B 13/00; H01L 21/67046
USPC .............................................. 73/760, 862.621
See application file for complete search history.

(56) References Cited

U.S. PATENT DOCUMENTS

| | | | | |
|---|---|---|---|---|
| 4,425,808 | A * | 1/1984 | Rand ................. | G01L 5/102 73/862.391 |
| 7,743,449 | B2 * | 6/2010 | Mikhaylichenko ...... | B08B 1/04 15/77 |
| 2010/0212702 | A1 * | 8/2010 | Hamada ............ | H01L 21/67046 134/115 R |
| 2015/0099433 | A1 * | 4/2015 | Tanaka .............. | H01L 21/67051 451/73 |
| 2015/0137494 | A1 * | 5/2015 | Le ..................... | B60R 19/16 280/735 |
| 2016/0243593 | A1 * | 8/2016 | Tanaka .............. | B08B 1/001 |

FOREIGN PATENT DOCUMENTS

| | | |
|---|---|---|
| JP | 2014-038983 A | 2/2014 |
| JP | 2014-103387 A | 6/2014 |

* cited by examiner

*Primary Examiner* — Max Noori
(74) *Attorney, Agent, or Firm* — Abelman, Frayne & Schwab

(57) ABSTRACT

A load measuring apparatus includes a waterproof load cell having a load measuring surface, of which the length is substantially equal to a diameter of the substrate, and a base plate that supports the waterproof load cell. The load measuring apparatus is set in a substrate cleaning apparatus like a substrate, and measures a load applied from the roll cleaning tool of the substrate cleaning apparatus using the waterproof load cell.

13 Claims, 9 Drawing Sheets

LOAD MEASURING APPARATUS AND LOAD MEASURING METHOD

CROSS-REFERENCE TO RELATED APPLICATIONS

This application is based on and claims priority from Japanese Patent Application No. 2015-033910, filed on Feb. 24, 2015, with the Japan Patent Office, the disclosure of which is incorporated herein in its entirety by reference.

TECHNICAL FIELD

The present disclosure relates to a load measuring apparatus and a load measuring method that are used in a substrate cleaning apparatus that cleans a substrate such as, for example, a wafer, by rubbing a roll cleaning tool against the substrate. In particular, the present disclosure relates to a load measuring apparatus and a load measuring method that measure the load applied to a substrate from a roll cleaning tool.

BACKGROUND

In manufacturing a semiconductor device, a substrate cleaning apparatus is used for cleaning a polished wafer. The substrate cleaning apparatus cleans the wafer by engaging a cylindrical roll cleaning tool such as, for example, a roll sponge or a roll brush, against a flat surface of the wafer while supplying a cleaning liquid to the wafer. In the wafer cleaning, it is requested that a load applied to the wafer by the roll cleaning tool be correctly controlled. In practice, however, it is difficult to measure the load on the spot while the wafer is being cleaned by the roll cleaning tool. Therefore, when starting up the substrate cleaning apparatus, a load adjustment (also referred to as a "load calibration") is performed so as to establish a correlation between a set value of the load and the load that is applied to the wafer.

The load adjustment is performed using a load measuring jig. FIG. 9 is a plan view illustrating a conventional load measuring jig, and FIG. 10 is a front view of the load measuring jig illustrated in FIG. 9. The load measuring jig includes a circular base plate 101 having a diameter that is the same as a wafer W, a load cell 105 attached to the base plate 101, and a load indicator 110 connected to the load cell 105 via a cable 106. The load cell 105 is arranged to be concentric to the base plate 101, and the length of the load cell 105 is about ½ of the diameter of the wafer W.

A recess 101a is formed in the central portion of the base plate 101, and the load cell 105 is placed in the recess 101a. Four (4) thin portions 112, which have substantially the same thickness as the wafer W, are formed in the outer periphery of the base plate 101. The top surfaces of the thin portions 112 are flush with the top surface of the load cell 105.

FIG. 11 is a plan view illustrating the load measuring jig set in a substrate cleaning apparatus in the related art. As illustrated in FIG. 11, the load measuring jig is held by a substrate holding mechanism (wafer holder) of the substrate cleaning apparatus, in a similar way as a wafer W is held. The substrate holding mechanism includes four (4) holding rollers 121, 122, 123, 124, and the outer periphery of the load measuring jig (and the wafer W) is held by the four holding rollers 121, 122, 123, 124.

FIG. 12 is a front view illustrating a state in which the load measuring jig set in the substrate cleaning apparatus measures a load in the related art, and FIG. 13 is a side view illustrating the load measuring jig illustrated in FIG. 12. In measuring the load, the roll cleaning tool is not used, and a dummy roll 115 dedicated to the load measurement is used instead. The dummy roll 115 has the same shape, size, and weight as the roll cleaning tool when the roll cleaning tool contains a cleaning liquid. Such a dummy roll 115 is used because, when a load measurement is performed using the roll cleaning tool containing the cleaning liquid, the cleaning liquid may infiltrate into the load cell 105 so that the load cell 105 may break down.

The dummy roll 115 is made of a material that is harder than the roll cleaning tool. For example, in the case where the roll cleaning tool is made of a polyvinyl alcohol (PVA), the dummy roll 115 is made of polyvinyl chloride (PVC). As illustrated in FIG. 13, the dummy roll 115 is attached to a roll shaft 130 of the substrate cleaning apparatus. The roll shaft 130, the dummy roll 115, and a roll rotating mechanism 133 are supported by a spring 132.

An air cylinder 135, which serves as a load generating apparatus, is connected to the roll rotating mechanism 133. The air cylinder 135 moves the dummy roll 115 downward against the repulsive force of the spring 132. When the load measurement of the dummy roll 115 is performed, the dummy roll 115 is pressed against the load cell 105 without being rotated. The load cell 105 measures the load applied from the dummy roll 115, and a load indicator 110 (see, e.g., FIG. 9) indicates the measured value of the load. See, for example, Japanese Patent Laid-Open Publication Nos. 2014-103387 and 2014-038983.

SUMMARY

An aspect of the present disclosure is a load measuring apparatus that measures a load applied to a substrate from a roll cleaning tool. The load measuring apparatus includes: a waterproof load cell including a load measuring surface having a length that is substantially equal to a diameter of the substrate; and a base plate that supports the waterproof load cell.

The foregoing summary is illustrative only and is not intended to be in any way limiting. In addition to the illustrative aspects, embodiments, and the features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

An air cylinder 135 configured to press a dummy roll 115 against a load cell 105 is operated by a gas. The force generated by the air cylinder 135 varies depending on the pressure of the gas, and the load measured by the load cell 105 varies following the pressure of the gas. In a load adjustment (load calibration), the load of the dummy roll 115 is measured by the load cell 105 while changing the pressure of the gas step by step so as to determine a correlation between the pressure of the gas and the corresponding load. The load applied to a wafer W from the roll cleaning tool during the cleaning of the wafer W may be estimated from the pressure of the gas supplied to the air cylinder 135.

Figure 14:
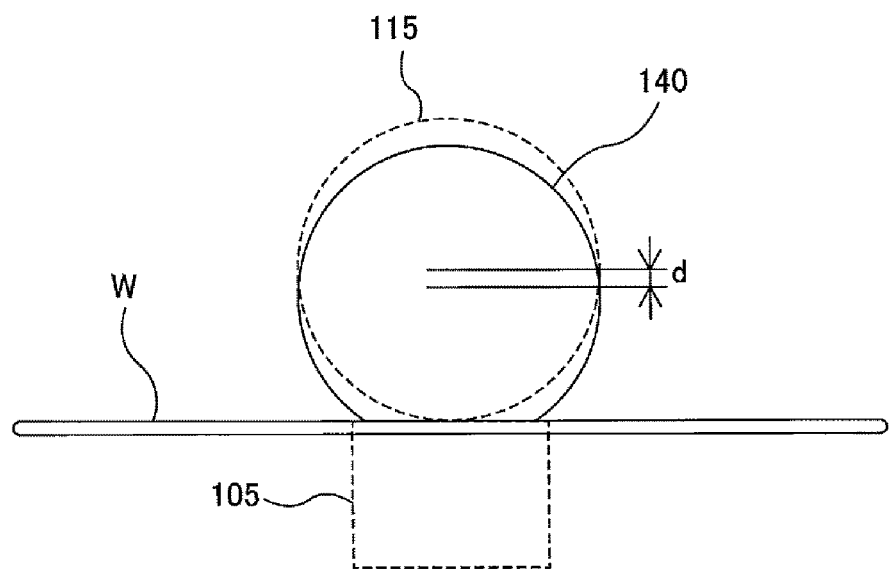
FIG. 14 is a view illustrating a difference between the height of a dummy roll when the dummy roll is pressed against a load cell and the height of a roll cleaning tool when the roll cleaning tool is pressed against a wafer.

When the load adjustment (load calibration) is terminated, the dummy roll 115 is removed from a roll shaft 130, the roll cleaning tool is attached to the roll shaft 130, and the cleaning of the wafer W is performed. FIG. 14 illustrates the roll cleaning tool when the roll cleaning tool is pressed against the wafer W. Since the roll cleaning tool 140 is made of a soft material such as, for example, polyvinyl alcohol (PVA), the lower portion of the roll cleaning tool 140 is deformed (crushed) when the roll cleaning tool 140 is pressed against the wafer W.

As illustrated in FIG. 14, since the dummy roll 115 is harder than the roll cleaning tool 140, there occurs a difference d between the height of the dummy roll 115 when the dummy roll 115 is pressed against the load cell 105 and the height of the roll cleaning tool 140 when the roll cleaning tool 140 is pressed against the wafer W, even if the force generated by the air cylinder 135 is the same. The height difference d causes a difference in repulsive force of the spring 132. As a result, a difference occurs between the load measured using the dummy roll 115 and the load when the wafer W is cleaned using the roll cleaning tool 140.

The present disclosure has been made in order to solve the above-described problems, and an object of the present disclosure is to provide a load measuring apparatus and a load measuring method that are capable of correctly measuring the load of a roll cleaning tool which is applied to a substrate such as, for example, a wafer.

In order to achieve the above-described objects, an aspect of the present disclosure provides a load measuring apparatus that measures a load applied to a substrate from a roll cleaning tool. The load measuring apparatus includes: a waterproof load cell including a load measuring surface having a length that is substantially equal to the diameter of the substrate; and a base plate that supports the waterproof load cell.

In an aspect of the present disclosure, the load measuring surface is a flat surface.

In an aspect of the present disclosure, a plurality of arc-shaped cutout portions are formed in an edge of the base plate, and the distance from the center of the base plate to the arc-shaped cutout portions is substantially equal to the radius of the substrate.

Another aspect of the present disclosure provides a load measuring method that measures the load applied to a substrate from a roll cleaning tool. The load measuring method includes: holding a load measuring apparatus including a waterproof load cell by a substrate holding mechanism, the waterproof load cell including a load measuring surface having a length that is substantially equal to a diameter of the substrate; pressing the roll cleaning tool against the waterproof load cell while rotating the roll cleaning tool around an axial center thereof; and measuring a load applied to the waterproof load cell from the roll cleaning tool while supplying a cleaning liquid to the roll cleaning tool that is rotating.

In an aspect of the present disclosure, the load measuring method further includes: measuring a deformed amount of the roll cleaning tool while the rotating roll cleaning tool is being pressed against the waterproof load cell.

In an aspect of the present disclosure, the load measuring method further includes: acquiring a plurality of measured values of the load and a plurality of measured values of the deformed amount of the roll cleaning tool by repeating the measuring of the load and the measuring of the deformed amount of the roll cleaning tool while changing a force to press the roll cleaning tool against the waterproof load cell; and deriving a relationship between the load and the deformed amount of the roll cleaning tool from the plurality of measured values of the load and the plurality of measured values of the deformed amount.

In an aspect of the present disclosure, the load measuring method further includes: acquiring a plurality of measured values of the load by repeating the measuring of the load while changing a rotating speed of the roll cleaning tool; and deriving a relationship between the load and the rotating speed of the roll cleaning tool from the plurality of measured values of the load and the corresponding rotating speeds of the roll cleaning tool.

According to the load measuring apparatus and load measuring method as described above, the load of the roll cleaning tool may be measured by using a roll cleaning tool that is practically used for cleaning a substrate. In particular, since the roll cleaning tool may be rotated and the cleaning liquid may be supplied to the roll cleaning tool during the measurement of the load, the waterproof load cell is able to measure the load of the roll cleaning tool under the same condition as the cleaning of the substrate. In addition, since the load measuring surface of the waterproof load cell has the same length as the diameter of the substrate, the deformed amount of the roll cleaning tool during the measurement of the load is substantially equal to the deformed amount of the roll cleaning tool during the cleaning of the substrate. Accordingly, it is possible to remove the difference between the load of the roll cleaning tool during the practical cleaning of the substrate and the load measured by the waterproof load cell.

Hereinafter, exemplary embodiments of the present disclosure will be described with reference to the accompanying drawings.

Figure 1:
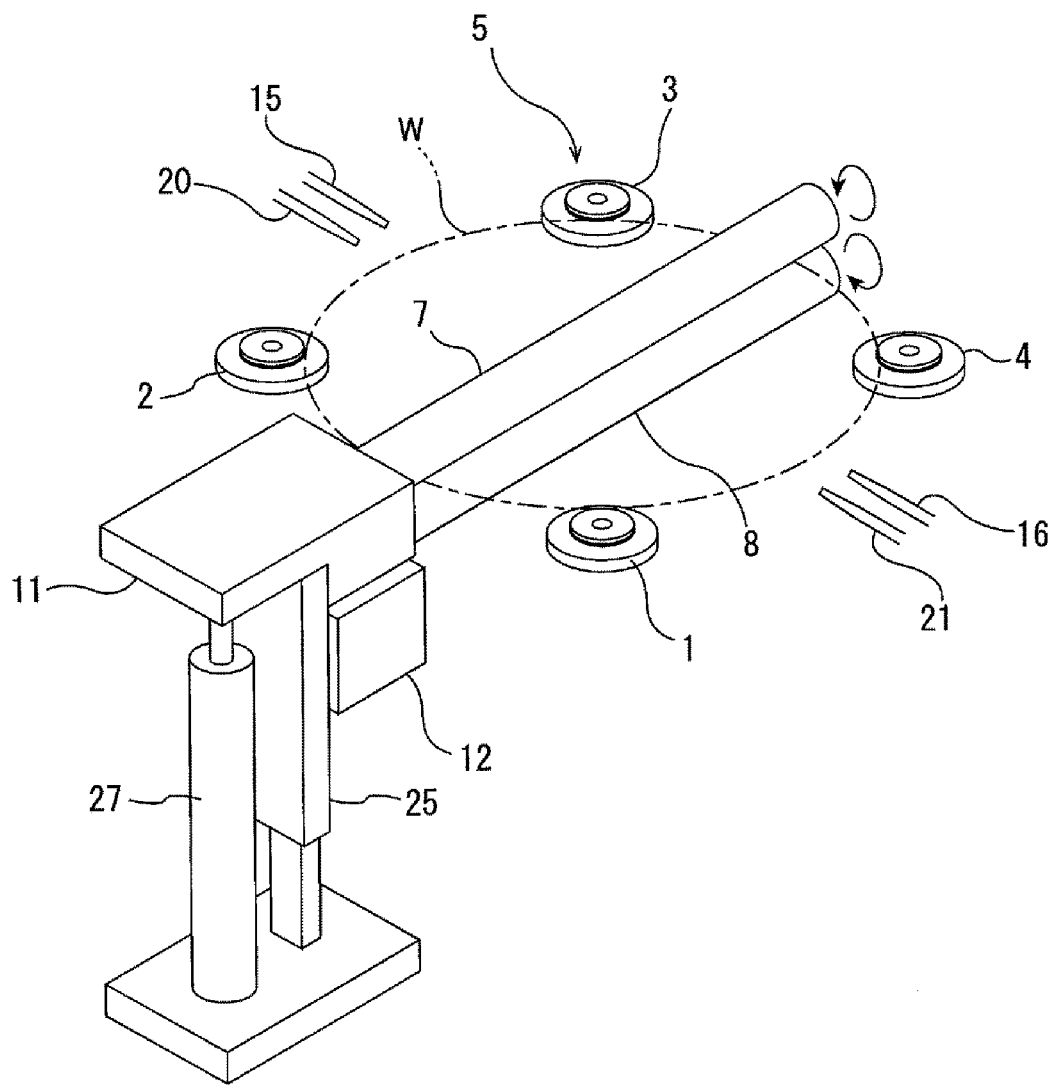
FIG. 1 is a perspective view illustrating a substrate cleaning apparatus.

FIG. 1 is a perspective view illustrating a substrate cleaning apparatus. As illustrated in FIG. 1, the substrate cleaning apparatus includes: a substrate holding mechanism 5 that includes four holding rollers 1, 2, 3, 4 each configured to hold the peripheral edge of a wafer W, which is an example of the substrate, and rotate the wafer W around an axial center thereof; cylindrical roll sponges (roll cleaning tools) 7, 8 each configured to be in contact with the top and bottom surfaces of the wafer W, respectively; roll rotating mechanisms 11, 12 each configured to rotate the roll sponges 7, 8 around the axial centers thereof, respectively; and upper pure water supply nozzles 15, 16 each configured to supply pure water to the top surface of the wafer W; and upper cleaning liquid supply nozzles 20, 21 configured to supply a cleaning liquid (chemical liquid) to the top surface of the wafer W. Although not illustrated, there are provided a lower pure water supply nozzle configured to supply pure water to the bottom surface of the wafer W, and a lower cleaning liquid supply nozzle configured to supply a cleaning liquid (chemical liquid) to the bottom surface of the wafer W.

The axial centers of the roll sponges 7, 8 extend parallel to the surface of the wafer W held by the holding rollers 1, 2, 3, 4. The holding rollers 1, 2, 3, 4 are configured to be movable toward/away from the wafer W by a driving mechanism (e.g., an air cylinder) (not illustrated). In addition, at least two of the holding rollers 1, 2, 3, 4 are connected to a roller rotating mechanism (not illustrated).

The roll rotating mechanism 11 configured to rotate the upper roll sponge 7 is attached to a guide rail 25 that guides the movement of the roll rotating mechanism 11 in the vertical direction. The roll rotating mechanism 11 is supported on a load generating mechanism 27, and the roll rotating mechanism 11 and the upper roll sponge 7 are configured to be moved in the vertical direction by the load generating mechanism 27. Although not illustrated, the roll rotating mechanism 12 configured to rotate the lower roll sponge 8 is also supported on the guide rail, and the roll rotating mechanism 12 and the lower roll sponge 8 are configured to be moved in the vertical direction by the load generating mechanism. As for the load generating mechanism, for example, a motor driving mechanism using a ball screw or an air cylinder may be used. When cleaning the wafer W, the roll sponges 7, 8 move in a mutually approaching direction and come in contact with the top and bottom surfaces of the wafer W, respectively. Occasionally, a roll brush may be used as the roll cleaning tool, instead of a roll sponge.

Next, descriptions will be made on a process of cleaning the wafer W. At least two of the holding rollers 1, 2, 3, 4 are rotated by a roller rotating mechanism (not illustrated) in the state where the peripheral edge of the wafer W is held by the holding rollers 1, 2, 3, 4, and as a result, the wafer W is rotated around the axial center thereof. Subsequently, the cleaning liquid is supplied to the top and bottoms surfaces of the wafer W from the upper cleaning liquid supply nozzles 20, 21 and the lower cleaning liquid supply nozzle (not illustrated). In this state, the roll sponges 7, 8 are in a slide contact with the top and bottom surfaces of the wafer W while rotating around the axial centers thereof, thereby cleaning the top and bottom surfaces of the wafer W.

After the cleaning of the wafer W, pure water is supplied to the rotating wafer W from the upper pure water supply nozzles 15, 16 and the lower pure water supply nozzle (not illustrated) such that the rinsing of the wafer W is performed.

In this state, the rinsing of the wafer W may be performed while the roll sponges 7, 8 are in a slide contact with the top and bottom surfaces of the wafer W, or may be performed while the roll sponges 7, 8 are spaced apart from the top and bottom surfaces of the wafer W.

Figure 2:
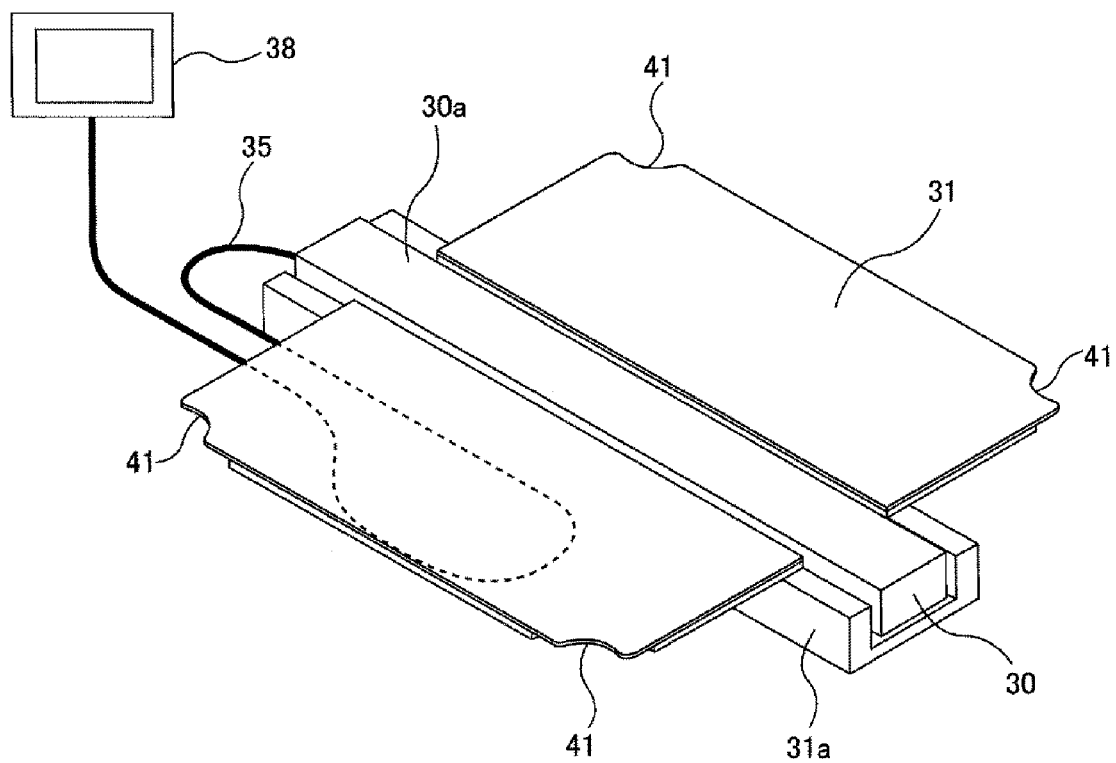
FIG. 2 is a perspective view illustrating a load measuring apparatus that measures the load of a roll sponge.

FIG. 2 is a perspective view illustrating a load measuring apparatus that measures the loads of the roll sponges 7, 8 illustrated in FIG. 1. The load measuring apparatus is set in a substrate cleaning apparatus when the loads of the roll sponges 7, 8 are measured. As illustrated in FIG. 2, the load measuring apparatus includes a load cell 30 configured to measure a load, a base plate 31 to which the load cell 30 is attached, and a load indicator 38 that is connected to the load cell 30 via a cable 35.

The load cell 30 includes a rectangular load measuring surface 30a. When the load of the upper roll sponge 7 is measured, the load measuring apparatus is held in the substrate holding mechanism 5 (see, e.g., FIG. 1) in the state where the load measuring surface 30a is oriented upward, and when the load of the lower roll sponge 8 is measured, the load measuring apparatus is held in the substrate holding mechanism 5 in the state where the load measuring surface 30a is oriented downward. The loads measured by the load cell 30 are indicated on the load indicator 38. In the case where load measurement data are sent to a data logger, the load indicator 38 may be provided with an analog output terminal that may output a measured load value as an analog value.

The load cell 30 is a waterproof load cell that is able to completely block the infiltration of liquid. The load cell 30 may have a waterproof structure of IP66 or higher. IP refers to a standard indicating a protection glade against infiltration of dust and liquid. The longitudinal dimension of the load measuring surface 30a of the load cell 30 (i.e., the length of the load measuring surface 30a) is substantially equal to the diameter of the wafer W. For example, when the diameter of the wafer W is 300 mm, the length of the load measuring surface 30a is 300 mm, and when the diameter of the wafer W is 450 mm, the length of the load measuring surface 30a is 450 mm. The load measuring surface 30a is formed in an even flat surface.

The cable 35 used herein is coated with a flexible waterproof coat. The cable 35 may be as thin as possible as long as it has a certain degree of strength. Since the cable 35 is connected to the load cell 30, the measured load value is changed when an external force is applied to the cable 35 while the load cell 30 measures the load. Accordingly, in order to prevent the change, the cable 35 is fixed to the base plate 31.

Figure 3:
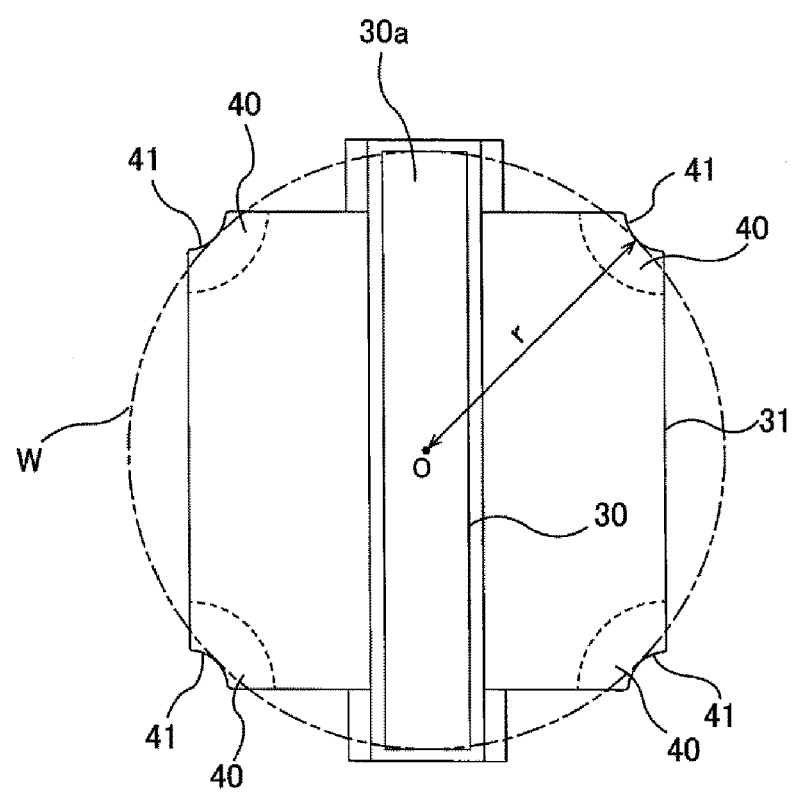
FIG. 3 is a plan view illustrating the load measuring apparatus.
Figure 4:
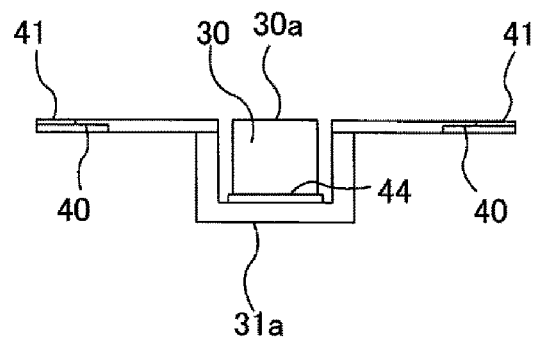
FIG. 4 is a front view illustrating the load measuring apparatus.

FIG. 3 is a plan view of the load measuring apparatus, and FIG. 4 is a front view of the load measuring apparatus. In FIGS. 3 and 4, the illustration of the cable 35 and the load indicator 38 is omitted. A recess 31a is formed in the central portion of the base plate 31, and the load cell 30 is placed in the recess 31a. The load cell 30 is arranged to be concentric to the base plate 31. The base plate 31 may be formed of a highly rigid metal such that the base plate 31 is not flexed when the roll sponge 7 is pressed against the load cell 30. For example, the base plate 31 is made of a stainless steel. In order to attain the lightening of the base plate 31 while maintaining the high rigidity, a lightening hole may be formed in the base plate 31.

Four (4) thin portions 40, which have substantially the same thickness as the wafer W, are formed in the outer periphery of the base plate 31, and an arc-shaped cutout portion 41 is formed in each of the thin portions 40. The distance from the center O of the base plate 31 to each of the cutout portions 41 is substantially equal to the radius r of the wafer W. The top surface of the base plate 31 including the four thin portions 40 is placed in the same plane as the load measuring surface 30a of the load cell 30. As illustrated in FIG. 4, a shim 44 may be interposed between the recess 31a of the base plate 31 and the load cell 30 to serve as a height adjustment member of the load cell 30.

Figure 5:
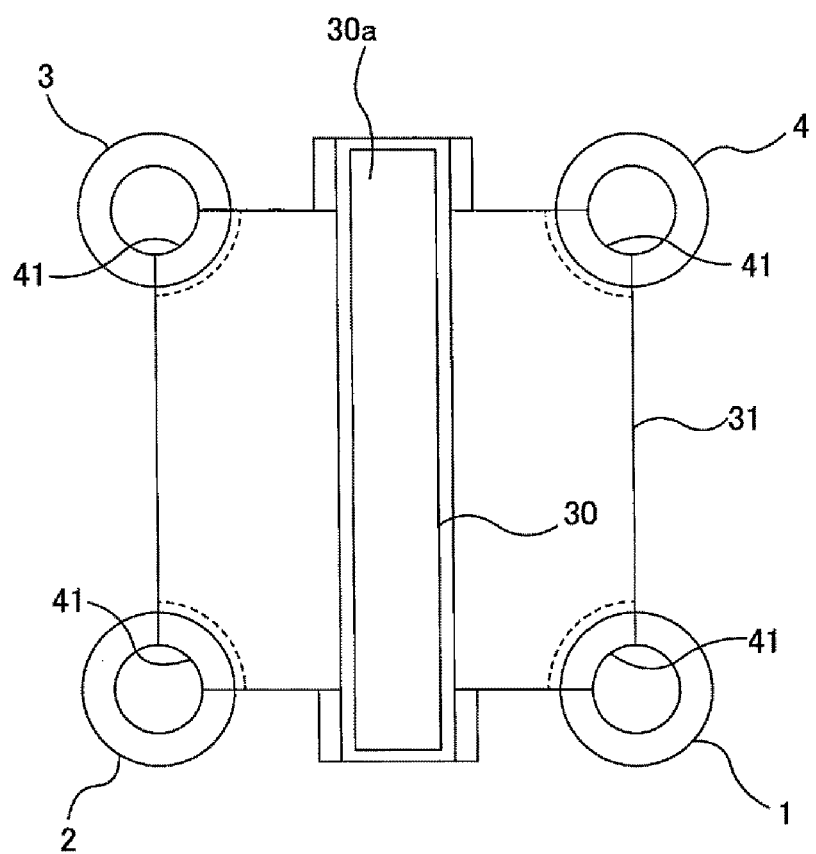
FIG. 5 is a plan view illustrating a state in which the load measuring apparatus is set in a substrate cleaning apparatus.

FIG. 5 is a plan view illustrating a state in which the load measuring apparatus is set in the substrate cleaning apparatus. As illustrated in FIG. 5, the load measuring apparatus is held by the substrate holding mechanism (wafer holder) 5 of the substrate cleaning apparatus, in a similar way as the wafer W is held. That is, the four cutout portions 41 of the base plate 31 are held by the four holding rollers 1, 2, 3, 4 of the substrate holding mechanism 5. Since each of the cutout portions 41 has an arc shape, the relative positioning of the load cell 30 in relation to the roll sponge 7 is attained when the four cutout portions 41 are held by the four holding rollers 1, 2, 3, 4, respectively. Specifically, when the four cutout portions 41 are held by the holding rollers 1, 2, 3, 4, the longitudinal direction of the load cell 30 coincides with the axial direction of the roll sponge 7 when viewed from a location above the load measuring apparatus.

Figure 6:
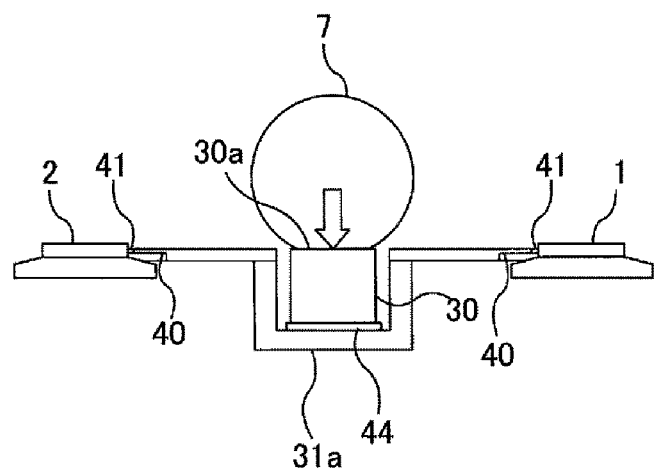
FIG. 6 is a front view illustrating a state in which the load measuring apparatus set in the substrate cleaning apparatus measures the load of a roll sponge.
Figure 7:
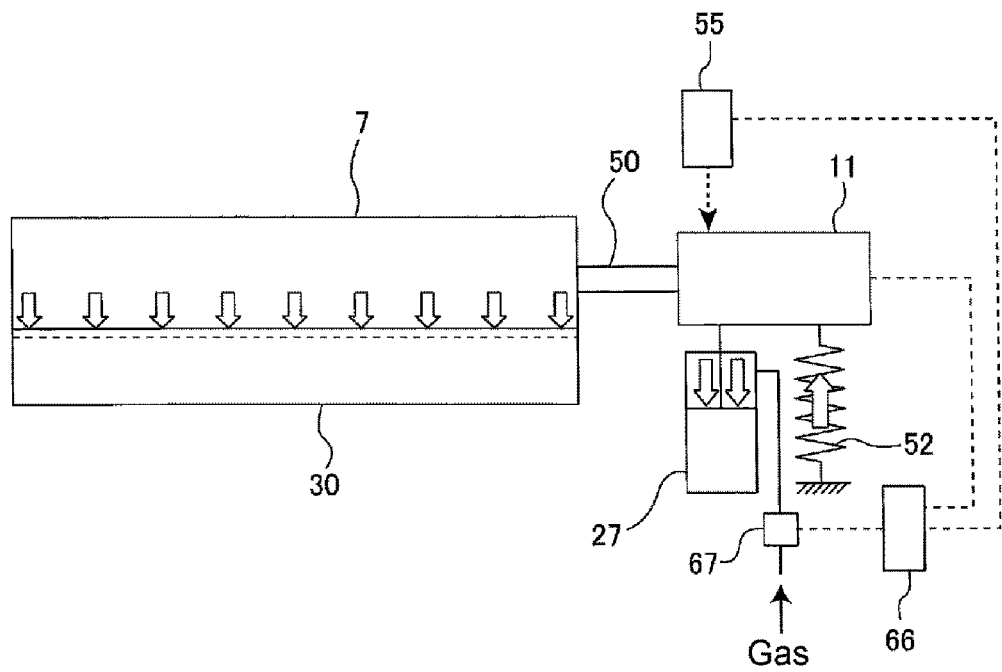
FIG. 7 is a side view illustrating the load measuring apparatus illustrated in FIG. 6.

FIG. 6 is a front view illustrating a state in which the load measuring apparatus set in the substrate cleaning apparatus measures the load of the roll sponge 7. FIG. 7 is a side view illustrating the load measuring apparatus illustrated in FIG. 6. The load measurement is performed in the state where the roll sponge 7 is pressed against the load measuring surface 30a of the load cell 30. As illustrated in FIG. 7, the roll sponge 7 is attached to a roll shaft 50. A spring 52 and a load generating mechanism 27 are connected to the roll rotating mechanism 11, and the roll shaft 50, the roll sponge 7, and the roll rotating mechanism 11 are supported by the spring 52.

As the roll sponge 7 is lowered against the repulsive force of the spring 52, the load generating mechanism 27 presses the roll sponge 7 against the load measuring surface 30a of the load cell 30. In the present exemplary embodiment, an air cylinder is used as the load generating mechanism 27. A displacement sensor 55 is arranged above the roll rotating mechanism 11. The displacement sensor 55 refers to a device that measures the downward displacement of the roll sponge 7. As for the displacement sensor 55, a non-contact type optical displacement sensor or a contact type distance meter may be used.

The roll sponge 7 is made of a relatively soft material such as, for example, polyvinyl alcohol (PVA). Accordingly, when the roll sponge 7 is pressed against the load measuring surface 30a of the load cell 30, the lower portion of the roll sponge 7 is deformed (crushed), as illustrated in FIG. 6. The load measurement and wafer cleaning of the roll sponge 7 are performed in the state where the lower portion of the roll sponge 7 is deformed as described above. The deformed amount (deformed amount) of the roll sponge 7 may be measured by the displacement sensor 55.

Figure 8:
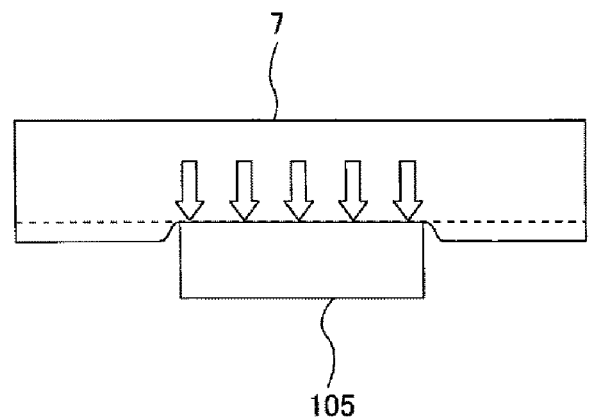
FIG. 8 is a side view illustrating a state in which a roll sponge is pressed against a load cell that is used in a conventional load measuring jig.
Figure 9:
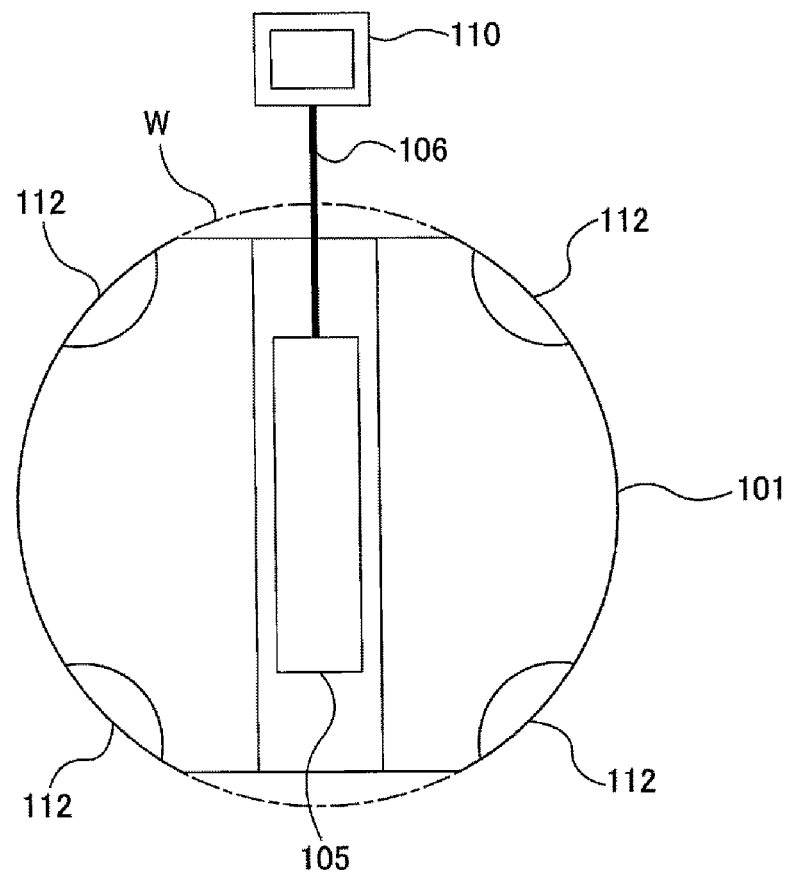
FIG. 9 is a plan view illustrating the conventional load measuring jig.
Figure 10:
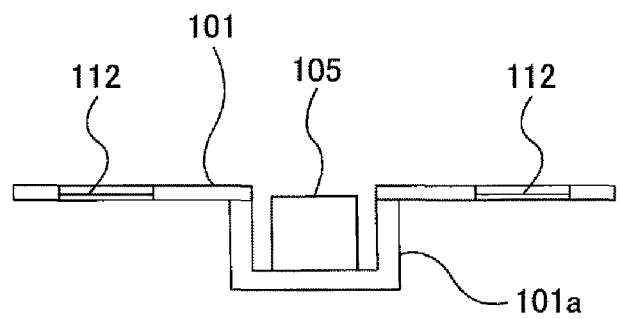
FIG. 10 is a front view illustrating the load measuring jig illustrated in FIG. 9.
Figure 11:
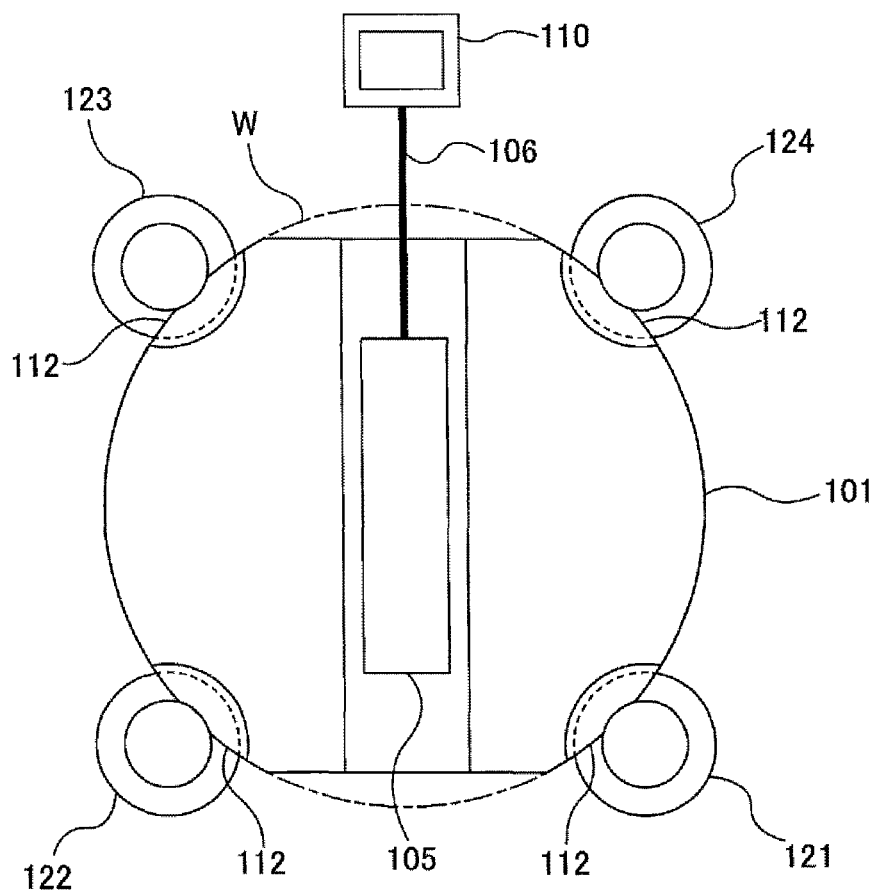
FIG. 11 is a plan view illustrating the load measuring jig set in a cleaning apparatus in the related art.
Figure 12:
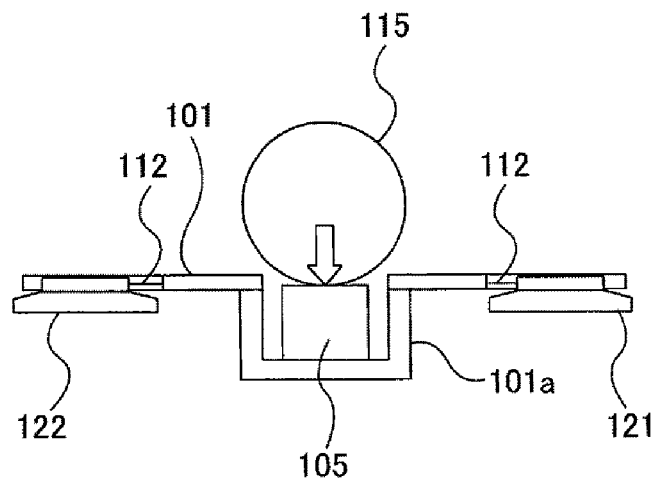
FIG. 12 is a front view illustrating a state in which the load measuring jig set in the cleaning apparatus measures a load in the related art.
Figure 13:
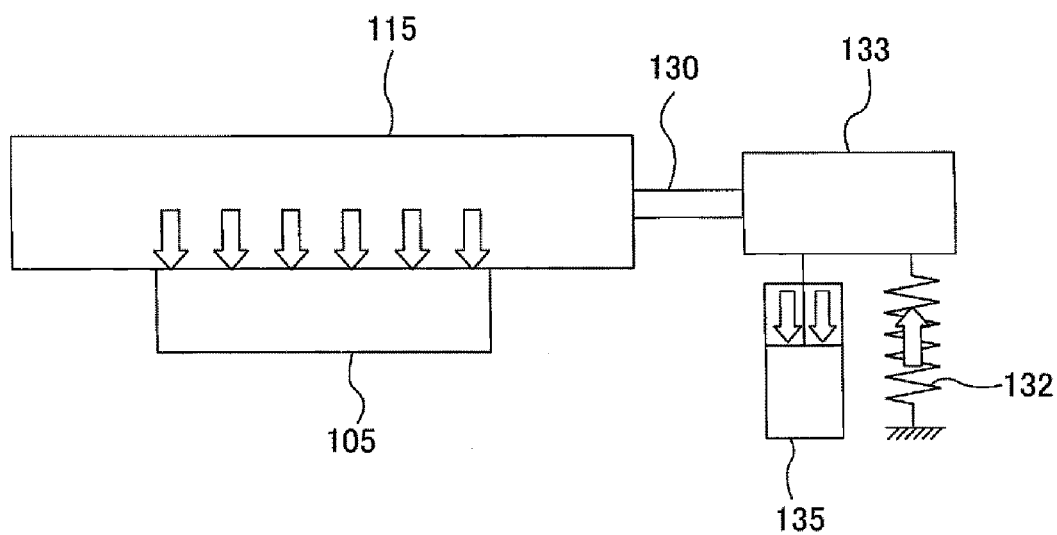
FIG. 13 is a side view illustrating the load measuring jig illustrated in FIG. 12.

Since the load measuring surface 30a of the load cell 30 has the same dimension as the diameter of the wafer W, the deformed amount of the roll sponge 7 during the load measurement is substantially equal to the deformed amount of the roll sponge 7 during the cleaning of the wafer W. The load cell 105 used in the conventional load measuring jig illustrated in FIG. 9 has a length of about ½ of the diameter of the wafer W. When the load is measured by using such a short load cell 105, the roll sponge 7 is more deformed than is deformed during the wafer cleaning, as illustrated in FIG. 8. The difference in deformed amount causes a difference in repulsive force of the spring 52, and as a result, a difference occurs between the load measured using the roll sponge 7 and the load when the wafer W is cleaned using the roll sponge 7.

According to the present exemplary embodiment, since the load measuring surface 30a of the load cell 30 has the same dimension as the diameter of the wafer W, the deformed amount of the roll sponge 7 during the load measurement is substantially equal to the deformed amount of the roll sponge 7 during the cleaning of the wafer W. Accordingly, it is possible to remove the difference between the load of the roll sponge 7 during the practical cleaning of the wafer W and the load measured by the load cell 30.

The load measurement of the roll sponge 7 is performed as follows. The load measuring apparatus is carried into the substrate cleaning apparatus, and held by the holding rollers 1, 2, 3, 4 of the substrate holding mechanism 5. The positioning of the load cell 30 in relation to the roll sponge 7 is completed when the cutout portions 41 of the load measuring apparatus are held by the holding rollers 1, 2, 3, 4, respectively. Unlike the wafer cleaning, the load measuring apparatus is not rotated during the load measurement.

Next, the roll sponge 7 is pressed against the load cell 30 by the load generating mechanism 27 while the roll sponge 7 is rotated around the axial center thereof. In addition, the load applied to the load cell 30 from the roll sponge 7 is measured while the cleaning liquid is supplied to the rotating roll sponge 7 from the upper cleaning liquid supply nozzles 20, 21.

According to the present exemplary embodiment, the load of the roll sponge 7 may be measured using the roll sponge 7 that is practically used in cleaning the wafer W. In particular, the load cell 30 is a waterproof load cell that is able to completely block the infiltration of the cleaning liquid. Thus, the cleaning liquid may be supplied to the roll sponge 7 during the measurement of the load in the same manner as during the cleaning of the wafer W.

While the cleaning of the wafer W is performed, the roll sponge 7 is rotated in the state where it contains the cleaning liquid. For this reason, the load applied to the wafer W is changed depending on the rotating speed of the roll sponge 7 by the action of a centrifugal force. More specifically, when the rotating speed (centrifugal force) of the roll sponge 7 increases, the deformation of the roll sponge 7 may not follow the rotating speed. As a result, the deformed amount of the roll sponge 7 decreases and the repulsive force of the spring 52 increases. For this reason, even if the force of the load generating mechanism 27 to press the roll sponge 7 against the wafer W is the same, the load applied to the wafer W is changed depending on the rotating speed of the roll sponge 7. According to the present exemplary embodiment, since the load measuring surface 30a of the load cell 30 is a flat surface similar to the surface of the wafer W, the roll sponge 7 may be rotated during the measurement of the load in the same manner as during the cleaning of the wafer W. Accordingly, the load cell 30 may measure the load of the roll sponge 7 under the same condition as that used during the cleaning of the wafer W.

The force applied by the load generating mechanism 27 to press the roll sponge 7 against the load cell 30, i.e. the pressure of the gas supplied to the air cylinder that forms the load generating mechanism 27 is adjusted by a pressure regulator 67 (see, e.g., FIG. 7). The pressure regulator 67 and the roll rotating mechanism 11 are connected to an operation controller 66 such that the operations of the load generating mechanism 27 and the roll rotating mechanism 11 are controlled by the operation controller 66. The force generated by the load generating mechanism 27 and the rotating speed of the roll sponge 7 are controlled by the operation controller 66.

The measurement of the load of the roll sponge 7 is performed a plurality of times while changing the pressure of the gas supplied to the load generating mechanism 27 step by step. The relationship between the load of the roll sponge 7 and the pressure of the gas may be derived from a plurality of measured values of the load obtained by the load cell 30 and corresponding pressures of the gas.

The displacement sensor 55 is also connected to the operation controller 66, and the measured values of the deformed amount (deformed amount) of the roll sponge 7, which are acquired by the displacement sensor 55, are sent to the operation controller 66. The measurement of the deformed amount of the roll sponge 7 is performed a plurality of times simultaneously with the measurement of the load of the roll sponge 7. That is, the measurement of the load of the roll sponge 7 and the measurement of the deformed amount of the roll sponge 7 are repeatedly performed while changing the pressure of the gas supplied to the load generating mechanism 27 step by step, so that a plurality of measured values of the load and a plurality of measured values of the corresponding deformed amount are acquired. As described above, the measurement of the load of the roll sponge 7 and the measurement of the deformed amount of the roll sponge 7 are performed while rotating the roll sponge 7 about the axial center thereof and while supplying the cleaning liquid to the roll sponge 7 that is rotating.

The relationship between the load of the roll sponge 7 and the deformed amount of the roll sponge 7 may be derived from the plurality of measured values of the load and the plurality of measured values of the deformed amount. The user may select an optimal combination of the load and deformed amount of the roll sponge 7 for cleaning the wafer, and may apply the selected optimal combination to the cleaning of the subsequent wafer having the same structure.

The plurality of measured values of the load may also be acquired by repeatedly measuring the load of the roll sponge 7 while changing the rotating speed of the roll sponge 7, and the relationship between the load and the rotating speed of the roll sponge 7 may be derived from the plurality of measured values of the load and the corresponding rotating speeds of the roll sponge 7. In this case, the force generated by the load generating mechanism 27 is constantly maintained.

The relationship between the load of the roll sponge 7 and the pressure of the gas, the relationship between the load of the roll sponge 7 and the deformed amount of the roll sponge 7, and the relationship between the load of the roll sponge 7 and the rotating speed of the roll sponge 7 may be derived using the operation controller 66 or a calculator such as, for example, an external computer.

The measurement of the load of the lower roll sponge 8 to the wafer W is performed in the state where the load measuring surface 30a is oriented downward. That is, the load measuring apparatus is held by the substrate holding mechanism 5 in the state where the load measuring surface 30a is oriented downward. The other operations are the same as those in the load measurement of the upper roll sponge 7 as described above.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A load measuring apparatus that measures a load applied to a substrate from a roll cleaning tool of a substrate cleaning apparatus, the load measuring apparatus comprising:
   a waterproof load cell including an elongated load measuring surface having a length that is substantially equal to a diameter of the substrate to be cleaned on which the load is being applied by the roll cleaning tool of the substrate cleaning apparatus; and
   a base plate having a recess at a center thereof that accommodates the waterproof load cell,
   wherein the elongated load measuring surface of the waterproof load cell is configured to be pressed directly by the roll cleaning tool of the substrate cleaning apparatus to be used for cleaning the substrate while a cleaning liquid is supplied to the roll cleaning tool thereby measuring the load applied to the waterproof load cell by the roll cleaning tool.

2. The load measuring apparatus of claim 1, wherein the load measuring surface is a flat surface.

3. The load measuring apparatus of claim 1, wherein a plurality of arc-shaped cutout portions are formed in an edge of the base plate, and a distance from a center of the base plate to the cutout portions is substantially equal to a radius of the substrate.

4. A load measuring method that measures a load applied to a substrate from a roll cleaning tool, the load measuring method comprising:
   holding a load measuring apparatus including a waterproof load cell by a substrate holding mechanism, the waterproof load cell including a load measuring surface having a length that is substantially equal to a diameter of the substrate;
   pressing the roll cleaning tool against the waterproof load cell while rotating the roll cleaning tool around an axial center thereof; and
   measuring the load applied to the waterproof load cell from the roll cleaning tool while supplying a cleaning liquid to the roll cleaning tool that is rotating.

5. The method of claim 4, further comprising:
   measuring a deformed amount of the roll cleaning tool while the roll cleaning tool is rotated and pressed against the waterproof load cell.

6. The method of claim 5, further comprising:
   acquiring a plurality of measured values of the load and a plurality of measured values of the deformed amount of the roll cleaning tool by repeating the measuring the load and the deformed amount of the roll cleaning tool while changing a force to press the roll cleaning tool against the waterproof load cell; and
   deriving a relationship between the load and the deformed amount of the roll cleaning tool from the plurality of measured values of the load and the plurality of measured values of the deformed amount.

7. The method of claim 5, further comprising:
   acquiring a plurality of measured values of the load by repeating the measuring the load while changing a rotating speed of the roll cleaning tool; and
   deriving a relationship between the load and the rotating speed of the roll cleaning tool from the plurality of measured values of the load and corresponding rotating speeds of the roll cleaning tool.

8. The load measuring apparatus of claim 1, further comprising a load display configured to display the load applied to the waterproof load cell by the roll cleaning tool, wherein the load display is connected to the waterproof load cell through a cable.

9. The load measuring apparatus of claim 1, wherein the substrate cleaning apparatus includes a displacement sensor configured to measure a deformed amount of the roll cleaning tool when the roll cleaning tool is contacted to the waterproof load cell of the load measuring apparatus to measure the load applied to the waterproof load cell by the roll cleaning tool.

10. The load measuring apparatus of claim 1, wherein the base plate is made of a metal.

11. The load measuring apparatus of claim 10, wherein the base plate is formed with a lightening hole.

12. The load measuring apparatus of claim 8, wherein at least a portion of the cable is fixed to the base plate.

13. A load measuring apparatus that measures a load applied to a substrate from a roll cleaning tool, the load measuring apparatus comprising:
- a waterproof load cell including a load measuring surface having a length that is substantially equal to a diameter of the substrate; and
- a base plate that supports the waterproof load cell,
- wherein a plurality of arc-shaped cutout portions are formed in an edge of the base plate, and a distance from a center of the base plate to the cutout portions is substantially equal to a radius of the substrate.

\* \* \* \* \*